United States Patent [19]
Sugiura et al.

[11] 3,953,748
[45] *Apr. 27, 1976

[54] INTERFACE CIRCUIT

[75] Inventors: Akio Sugiura, Nagoya; Atsutoshi Okamoto, Toyohashi; Motoyoshi Suzuki, Kariya, all of Japan

[73] Assignee: Nippondenso Co., Ltd., Kariya, Japan

[ * ] Notice: The portion of the term of this patent subsequent to Jan. 14, 1992, has been disclaimed.

[22] Filed: Nov. 6, 1974

[21] Appl. No.: 521,447

Related U.S. Application Data

[63] Continuation of Ser. No. 338,609, March 6, 1973, Pat. No. 3,860,830.

[30] Foreign Application Priority Data

Mar. 10, 1972 Japan .............................. 47-25093

[52] U.S. Cl. ............................. 307/253; 307/205; 307/214; 307/303; 307/DIG. 1
[51] Int. Cl.² ........................................ H03K 17/60
[58] Field of Search ........... 307/205, 208, 253, 214, 307/215, 202, 303, DIG. 1, 253

[56] References Cited
UNITED STATES PATENTS

| | | |
|---|---|---|
| 3,394,268 | 7/1968 | Murphy ............................. 307/303 |
| 3,448,397 | 6/1969 | Lin et al. ............................ 307/303 |
| 3,603,813 | 9/1971 | Hall ................................ 307/302 X |
| 3,654,486 | 4/1972 | Cubert ............................... 307/214 |
| 3,662,188 | 5/1972 | Williams ............................ 307/205 |

OTHER PUBLICATIONS

RCA Technical Notes "Universal Interface Circuit" by Yee RCA TN No. 628, 8/1965.
IBM Tech. Disclosure Bul., Vol. 9, No. 9, 2/1967, "IGFET Circuit" by Froemke.
EEN, Vol. 14, No. 1, pp. 41–43, 4/1972, "High Speed Interface Circuit For Driving MOS From TTL".

*Primary Examiner*—John S. Heyman
*Attorney, Agent, or Firm*—Cushman, Darby & Cushman

[57] ABSTRACT

A combination of a linear integrated circuit supplied with voltages from a first dc voltage source and a second dc voltage source of lower power capacity and opposite polarity, a switching circuit for performing a switching action according to the output signal of the linear integrated circuit without consuming power from the low capacity dc voltage source, and a digital circuit operable by the reception of the switching signal from the switching circuit. The low level dc voltage source provides a voltage by converting the voltage supplied from the first dc voltage source.

1 Claim, 7 Drawing Figures

INTERFACE CIRCUIT

This is a continuation, of application Ser. No. 338,609 filed Mar. 6, 1973, now U.S. Pat. No. 3,860,830.

BACKGROUND OF THE INVENTION

1. Field of the Invention

This invention relates to an interface circuit for use in connecting a linear semiconductor integrated circuit (referred to as linear IC, hereinbelow) and a digital semiconductor integrated circuit (referred to as digital IC, hereinbelow).

2. Description of the Prior Art

Conventionally, in the voltage source circuit of electronic devices for automobiles, etc., a negative voltage is generated by a converter. Voltage sources using a converter provide a large output current, but have such drawbacks that the cost becomes high and the total body is bulky. Smaller voltage source circuits, however, cannot provide a large output current. In the case where such a small voltage source circuit is used to supply a negative voltage to a linear IC, and when a DTL (diode-transistor logic) or a TTL (transistor-transistor logic) is connected to the output of said linear IC, the load current for said voltage source circuit becomes large and the negative voltage rises (i.e., the absolute value of the negative voltage decreases) to affect the operation of the linear IC.

SUMMARY OF THE INVENTION

An object of this invention is to provide an interface circuit capable of connecting a first linear IC and another digital IC without affecting the operation of the linear IC in the case of using a voltage source of small current capacity as the voltage source for supplying a negative voltage to the linear IC.

According to this invention, the output terminal of a first linear IC is connected to the base of a transistor, a second digital IC, such as a DTL or a TTL, is connected to the collector of said transistor, and arrangement is made to block off a current flowing into said output terminal when the output of said first linear IC is of low level. In such an arrangement, even when a voltage source circuit of small current capacity utilizing the charge and discharge of a capacitor is used as the voltage source circuit for generating a negative voltage, said negative voltage does not rise and can afford the normal operation of said first linear IC. Further, this invention is advantageous in that a linear IC can be connected to a digital IC such as a DTL or a TTL, with a simple circuit structure.

Other objects, features and advantages of this invention will become apparent from the following detailed description of the preferred embodiments in conjunction with the accompanying drawings.

DESCRIPTION OF THE PREFERRED EMBODIMENTS

Figure 1:
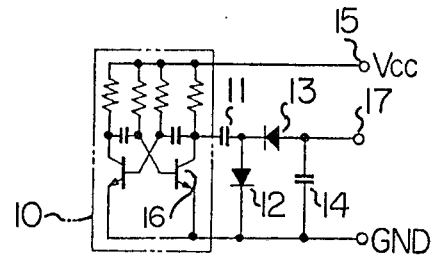
FIG. 1 is an electrical connection diagram of an example of a voltage source circuit used in the circuit of this invention.

The present invention will be described on the embodiments shown in the drawings hereinafter. First, the voltage source circuit used in the interface circuit of this invention will be described referring to FIG. 1. In FIG. 1, numeral 10 indicates an oscillator (astable multivibrator), 11 and 14 a first and a second capacitor having a capacitance $C_1$ and $C_2$ respectively, 12 and 13 a first and a second diodes, 15 the positive terminal of a dc source, and 17 an output terminal. When the oscillator 10 starts its self-excited oscillation, a rectangular wave voltage having a peak value $E_c$ equal to the source voltage appears at the collector of a transistor 16. When said transistor 16 is cut off, the collector voltage goes from zero to $E_c$ so that a charge of $C_1.E_c$ is built up in said first capacitor 11. Then, when the transistor 16 is rendered conductive and the collector voltage goes to zero, a discharging circuit for said first capacitor 11 is formed through the second capacitor 14. Thus, a voltage of $C_1.E_c/(C_1+C_2)$ appears across said second capacitor 14 with the output terminal 17 being of the negative polarity which is opposite to the positive polarity of the source terminal 15. Thus, a negative voltage, being of the opposite polarity to the source voltage can be easily obtained at the output terminal 17. This circuit has a small structure, high reliability, but provides only a relative small output current.

Figure 2:
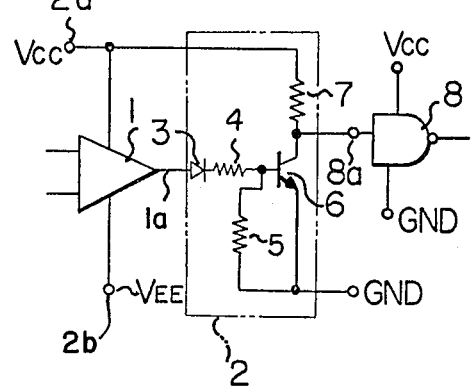
FIG. 2 is an electrical connection diagram of a first embodiment of the interface circuit according to this invention.

FIG. 2 shows a first embodiment of the present invention using the above-mentioned source circuit, in which numeral 1 indicates a linear IC, 1a an output terminal thereof, 2a a positive voltage supply terminal, 2b a negative voltage supply terminal connected to the output terminal 17 of the circuit shown in FIG. 1, 3 a diode, 4 a resistor for limiting current, 5 a biasing resistor for a transistor 6, 7 a load resistor for said transistor 6, 8 a digital IC such as DTL or TTL, and 8a an input terminal thereof.

Figure 3:
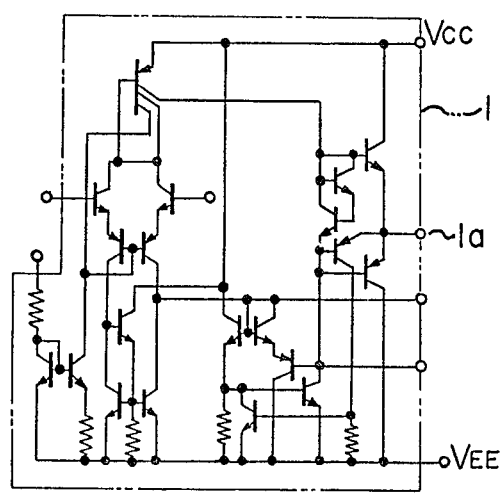
FIG. 3 is an electrical connection diagram of an example of the inside of the linear IC shown in FIG. 2.
Figure 4:
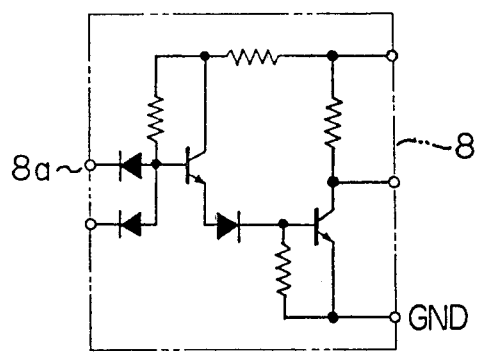
FIGS. 4 and 5 are electrical connection diagrams of examples of the inside of the digital IC shown in FIG. 2.
Figure 5:
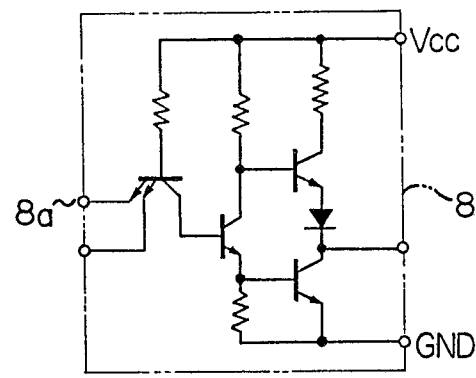

For said linear IC 1 the circuit shown in FIG. 3 may be used and for said digital IC 8 a DTL circuit as shown in FIG. 4 or a TTL circuit as shown in FIG. 5 may be used.

The operation of the above circuit will be described next. When the output of the linear IC 1 is at a high ("H") level, a current flows out of the linear IC 1 and is supplied to the transistor 6 through the diode 3 to bring the transistor 6 into the conductive state. Then, the collector voltage of the transistor 6 becomes low ("L"). Here, the current flowing from the linear IC 1 is limited by the resistor 4. Next, when the output of said linear IC 1 goes to the low L level, the base current of the transistor 6 becomes zero, hence the transistor 6 is cut off and the collector voltage thereof goes to the H level. The output current of the linear IC 1 in this case is formed only of the actuating current of said linear IC 1 flowing from the voltage supply terminals 2a to 2b, and any current flowing into the linear IC 1 from outside is shut off by the diode 3. Thus, only a minute current, i.e., the actuating current for the linear IC 1 is allowed to flow through the voltage supply terminal 2b. Thus, the negative voltage does not rise and the operation of the linear IC 1 can be performed normally.

Figure 6:
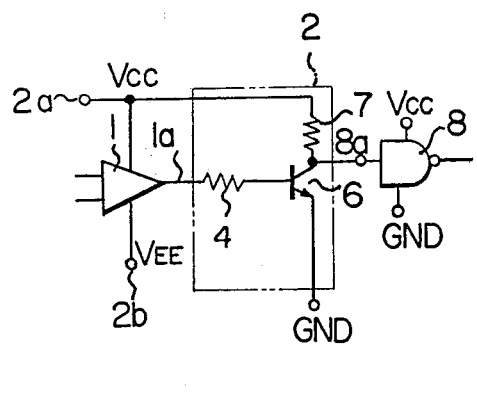
FIGS. 6 and 7 are electrical connection diagrams of a second and a third embodiments of the interface circuit according to this invention.
Figure 7:
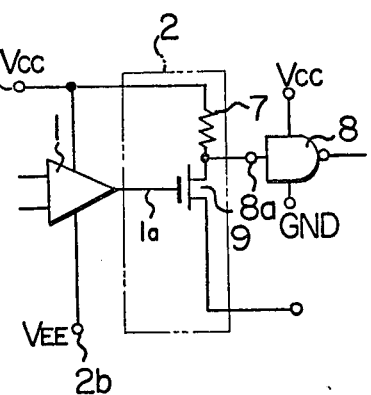

FIGS. 6 and 7 show a second and a third embodiment of the present invention in which the circuit of FIG. 6 can be used in the case when the negative voltage applied to the voltage supply terminal 2b is of a smaller value than the reverse breakdown voltage of the base-emitter of the transistor 6 and the circuit of FIG. 7 utilizes a field effect transistor 9 of a MOS IC in place of the transistor 6.

In the circuits of FIGS. 6 and 7, the prevention of an external current from flowing into the terminal 2b is achieved by the isolation of the base-emitter or the gate-source of the transistor 6 or 9. Therefore, if the negative voltage applied to the supply terminal 2b becomes lower (i.e., the absolute value of the negative voltage becomes larger), the isolation may be broken and in such a case a reverse current blocking diode 3 as shown in FIG. 2 becomes necessary.

We claim:
1. An interface circuit comprising in combination:
   a first dc voltage supply means for supplying a dc voltage;
   a second dc voltage supply means of low current and voltage capacity operative to invert the voltage from said first dc voltage supply means into a dc voltage having the opposite polarity and lower level than that of the voltage from said first dc voltage supply means;
   a linear integrated circuit energized by the voltages from said fist and second voltage supply means and having an output terminal to develop an output signal, the voltage of opposite polarity from said second dc voltage supply means being applied to cancel the threshold voltage of the linear integrated circuit;
   a digital integrated circuit having an input terminal; and
   a switching circuit for connecting said linear integrated circuit to said digital integrated circuit, comprising a dc current blocking means connected to the output terminal of said linear integrated circuit, a transistor having a base connected to said dc current blocking means and a collector connected to the input terminal of said digital integrated circuit and being connected through a load resistance to said first dc voltage supply means, said blocking means serving to block a dc current of the same polarity as the opposite polarity voltage of said second dc voltage source from flowing out of the linear integrated circuit from said second dc voltage source toward the switching circuit and serving to block a dc current of the same polarity as the voltage of said first dc voltage supply from flowing into the output terminal of the linear integrated circuit from the switching circuit, thereby interfacing the linear integrated circuit and the digital integrated circuit with a minimized consumption of the power from the second dc voltage supply means.

* * * * *